United States Patent [19]

Lee et al.

[11] Patent Number: 5,583,064
[45] Date of Patent: Dec. 10, 1996

[54] SEMICONDUCTOR DEVICE AND PROCESS FOR FORMATION THEREOF

[75] Inventors: Chang-Jae Lee; Hyuk-Jin Kwon, both of Chungcheongbuk-do, Rep. of Korea

[73] Assignee: Goldstar Electron Co. Ltd., Cheongju, Rep. of Korea

[21] Appl. No.: 376,517

[22] Filed: Jan. 23, 1995

[30] Foreign Application Priority Data

Jan. 28, 1994 [KR] Rep. of Korea .................. 94-1571

[51] Int. Cl.$^6$ .................. H01L 21/265; H01L 21/302; H01L 21/304; H01L 21/76
[52] U.S. Cl. .................. 437/41; 437/29; 437/69
[58] Field of Search .................. 437/40 RG, 41 RG, 437/29, 69

[56] References Cited

U.S. PATENT DOCUMENTS

| | | | |
|---|---|---|---|
| 4,639,274 | 1/1987 | Krishna | 437/69 |
| 5,108,937 | 4/1992 | Tsai et al. | 437/40 |
| 5,248,893 | 9/1993 | Sakamoto | 257/409 |
| 5,342,796 | 8/1994 | Ahn et al. | 437/41 |
| 5,371,024 | 12/1994 | Hieda et al. | 437/40 RG |

FOREIGN PATENT DOCUMENTS

| | | | |
|---|---|---|---|
| 57-85266 | 5/1982 | Japan | 437/40 RG |
| 62-296472A | 12/1987 | Japan | 437/40 RG |
| 6-112309A | 4/1994 | Japan | 437/41 RG |

OTHER PUBLICATIONS

J. E. Moon, et al.; "A New LDD Structure: Total Overlap with Polysilicon Spacer (TOPS)"; vol. 11, No. 5, May 1990; pp. 221–223.

James R. Pfiester, et al.; "A Self–Aligned Elevated Source/Drain MOSFET"; vol. 11, No. 9, Sep. 1990; pp. 365–367.

Shigeo Onishi, et al.; "Formation of a Defect–Free Junction Layer by Controlling Defects Due to As$^+$ Implantation"; IEEE/IRPS 1991; pp. 255–259.

Eiji Takeda, et al.; "New Grooved–Gate MOSFET with Drain Separated from Channel Implanted Region (DSC)"; IEEE 1983; pp. 681–686.

K. Sunouchi, et al.; "Double LDD Concave (DLC) Structure for Sub–Half Michon Mosfet"; IEDM 88; pp. 226–229.

*Primary Examiner*—Mary Wilczewski
*Assistant Examiner*—Brian K. Dutton
*Attorney, Agent, or Firm*—Alan R. Loudermilk

[57] ABSTRACT

A recess is formed (dug) into the surface of a substrate to form a gate channel in the recess, so that a monocrystalline source/drain region can be formed at a level higher than that of the channel. The process includes the steps of: (a) forming an insulating layer and an oxidation preventing layer on a semiconductor substrate, and removing the oxidation preventing layer of a channel region of the transistor by an etching process; (b) forming an oxide layer on the channel region of the transistor by thermally oxidizing the semiconductor substrate, removing the oxidation preventing layer, and carrying out a first ion implantation on the whole surface; (c) removing the oxide layer, and forming the channel of the transistor in the form of a recess so as for the recess to be positioned lower than the surface of the substrate; (d) forming a gate electrode in the recess; and (e) carrying out a second ion implantation on the whole surface, and carrying out a heat treatment to form a source/drain region.

11 Claims, 5 Drawing Sheets

SEMICONDUCTOR DEVICE AND PROCESS FOR FORMATION THEREOF

FIELD OF THE INVENTION

The present invention relates to processes for formation of MOS transistors, and more particularly to processes for formation of MOSFETs suitable for formation of high density devices.

BACKGROUND OF THE INVENTION

In MOS IC formation techniques, progress has been made such that the size of unit cells of MOS devices has been reduced by 10% annually. Accordingly, the size of MOS devices (such as gate length, Lg) has been reduced from micron scale (Lg≦1.0 µm) to sub-micron scale (Lg≦0.35 µm) for increasing the density and for improving the performance of the IC.

As the size of the device is reduced to the sub-micron scale, it has become difficult to optimize the short channel effect, punch-through voltage, series resistance, current driving capability, hot carrier characteristics and the like. Accordingly, studies have been made in an attempt to improve the above factors. Particularly, of the many different characteristics of the sub-micron scale device, it is the most difficult problem to simultaneously satisfy the short channel effect and the hot carrier characteristics. Many techniques for solving this problem have been developed and reported.

As a shallow junction formation technique for reducing the short channel effect, studies have been made on silicide and RTP (rapid thermal processing). Further, studies are being conducted with respect to source/drain structures in which the source/drain region is formed with a level higher than that of the gate. This elevated source/drain structure which is formed higher than the gate includes: a recessed gate structure in which the gate is formed by recessing a silicon substrate; a polysilicon source/drain structure in which polysilicon is selectively grown on the source/drain region, and then a doping is carried out to form a shallow junction; and an epitaxial source/drain structure in which a monocrystalline silicon is selectively grown on the source/drain region instead of polysilicon. The above structures are selected depending on the process employed.

The problems of these structures are as follows. That is, in the case of the recessed gate structure, the length of the gate has a three-dimensional form, and, therefore, the gate has a sufficiently long channel, so that the characteristics would be superior viewed from the short channel effect. However, the integrity of the oxide layer near the corner of the recessed gate is low. Further, the current driving capability is lowered due to the increase of the channel length.

In the case of the polysilicon source/drain structure, the dopant is diffused from the polysilicon to the silicon substrate so as to form a shallow junction. Therefore, the drain region on the substrate is completely depleted under a high voltage, and, therefore, the end portion of the depleted junction is contacted to the polysilicon layer, with the result that a large leakage current is generated.

In the case of the epitaxial source/drain structure, a monocrystalline source/drain region is formed through selective epitaxial growth instead of using polysilicon in elevating the source/drain region as in the case of the polysilicon source/drain structure, thereby solving the problem of the leakage current. However, both the polysilicon source/drain structure and the epitaxial source/drain structure have junctions on a level deeper than the gates, and, therefore, the hot carrier problem remains as in the case of the conventional LDD structure. Further, in the case of the epitaxial source/drain, the technique of selectively growing the epitaxial layer has not yet been matured, and a high temperature is required, with the result that it is difficult to control the depth of the shallow junction.

The above conventional techniques will be described in detail referring to the drawings.

As the size of the transistor is reduced, if a high electric field is imposed between the source and drain of the transistor, the carriers (electrons) introduced from the source are highly accelerated to become hot carriers, thereby introducing a problem. When the device is progressed to a sub-micron scale, this problem is further worsened. In order to solve this problem, a process for forming the drain in the form of an LDD (lightly doped drain) was reported in "Electron Device Letter" (1980 IEEE, ED-27, p. 1359).

As illustrated in FIG. 1, this process is carried out in the following manner. That is, gate 12 is formed upon silicon substrate 11, and an ion implantation is carried out in a small amount. A CVD $SiO_2$ is uniformly coated, and a side wall spacer is formed on the side walls of the gate by carrying out an RIE (reactive ion etching). An ion implantation is carried out to form a source/drain region in the conventional manner, and a heat treatment is carried out, thereby forming source 13 and drain 14 with LDD region 15 formed thereon. Thus, the formation of the device is completed.

However, when a device of less than half micron scale is required, the short channel effect problem newly appears besides the hot carrier problem. In order to give a solution to this problem, a process for formation of a recessed gate structure was reported in "Technical Digest" (1988 IEDM, p. 226), and according to this process, a recess is made by etching a silicon substrate, and a gate is formed in the recess. Further, a polysilicon source/drain structure was reported in "Electron Device Letter" (1986 IEEE, EDL-7, p. 314), and an epitaxial source/drain structure was reported in "Electron Device Letter" (1990 IEEE, EDL-11, p. 365), in which a monocrystalline source/drain region is formed by growing an epitaxial layer instead of the polysilicon.

As illustrated in FIG. 2, the process for formation of a device having a recessed gate is carried out in the following manner. First, lightly doped drain junction 22 is formed on silicon substrate 21. Then, this portion of silicon substrate 21 is trench-etched, and a doping is carried out to form doped channel region 23. Gate oxide layer 24 is formed, and gate 25 is formed using polysilicon, thereby completing the formation of the device.

As illustrated in FIG. 3, the process for formation of a device having a polysilicon gate is carried out in the following manner. First, gate 32 is formed on silicon substrate 31, and polysilicon layer 33 is selectively deposited on the source/drain regions, so that the dopant may be diffused from polysilicon layer 33 to the substrate, thereby forming junctions 34.

Finally, the process for formation of the epitaxial source/drain structure is carried out in the following manner. First, as illustrated in FIG. 4, gate 42 is formed on substrate 41, and LDD region 43 is formed. Side wall 44 is formed, and epitaxial monocrystalline layer 45 is selectively grown. A doping is carried out, thereby completing the formation of the transistor.

As already mentioned above, in the case of the recessed gate structure, the integrity of the gate oxide layer is worsened. Further, due to the increase in the length of the channel, and due to the consequent increase of the resistance of the long channel between the source and drain, the current driving capability is lowered.

In the case of the device having the polysilicon source/drain structure, because of the shallow junction which is formed through the diffusion of the dopant from the polysilicon to the substrate, the drain region is completely depleted under a high drain voltage. Consequently, the depleted edge of the junction is contacted with the polysilicon layer, thereby producing a large amount of leakage current.

Meanwhile, in the case of the epitaxial source/drain structure in which an epitaxially grown silicon layer is utilized, the leakage current problem can be solved. However, as in the case of the polysilicon source/drain structure, the junction is formed on a level deeper than the gate, and therefore, the hot carrier problem occurs as in the case of the conventional LDD structure.

SUMMARY OF THE INVENTION

An object of the present invention is to provide a MOS device and a process for formation thereof in which the source/drain region ($n^+$ junction) is made to be positioned higher than the gate so as to solve the problems of the hot carriers and the lowering of the reliability, and a new LDD structure is provided, thereby simultaneously solving the problems of the short channel effect and the hot carriers.

The present invention is characterized in that a trench is formed (dug) to form a gate channel, a source/drain region is formed at a level higher than the channel, and an LDD region is formed without forming a gate side wall spacer, thereby forming a MOS transistor.

According to one aspect of the present invention, the process for formation of the MOS transistor according to the present invention includes the steps of: (a) forming an insulating layer and an oxidation preventing layer on a semiconductor substrate, and removing the oxidation preventing layer of a channel region of the transistor by etching it; (b) forming an oxide layer on the channel region of the transistor by thermally oxidizing the semiconductor substrate, removing the oxidation preventing layer, and carrying out a first ion implantation on the whole surface; (c) removing the oxide layer, and forming the channel of the transistor in the form of a recess so as for the recess to be positioned lower than the surface of the substrate; (d) forming a gate electrode in the recess; and (e) carrying out a second ion implantation on the whole surface, and carrying out a heat treatment to form a source/drain region.

According to another aspect of the present invention, the process for formation of the MOS transistor according to the present invention includes the steps of: (a) forming an insulating layer and an oxidation preventing layer on a semiconductor substrate, and carrying out a photo etching to remove the oxidation preventing layer on the portion where the gate electrode of the transistor is to be formed; (b) carrying out a thermal oxidation on the semiconductor substrate so as to form an oxide layer on the portion where the gate electrode of the transistor is to be formed, and carrying out an anisotropic dry etching on the oxide layer utilizing the oxidation preventing layer as a mask so as to expose the substrate; (c) forming a gate insulating layer, depositing a conductive layer for forming the gate electrode, and carrying out an etch back so as to form the gate electrode; (d) removing the oxidation preventing layer, and carrying out a high concentration ion implantation for forming a high concentration impurity region on the whole surface; and (e) removing the oxide layer, carrying out a low concentration ion implantation on the whole surface for forming a low concentration diffusion region, and carrying out a heat treatment to form a source/drain region.

The oxidation preventing layer is formed utilizing a silicon nitride layer, the conductive layer is formed utilizing a doped polysilicon layer, and the gate insulating layer is formed by carrying out a thermal oxidation on the silicon substrate. Further, it utilizes the fact that the semiconductor substrate has a p well and an n well, and that the substrate is divided into an active region (where many electric elements are to be formed) and a non-active region. The impurity used in the high and low concentration ion implantation is $BF_2^+$ ions in the case of a pMOS device, and $As^+$ ions in the case of an nMOS device. The high concentration ion implantation is carried out using $As^+$ ions at a concentration of about $5.0 \times 10^{15}$ ions/cm$^2$ with an energy of about 40 KeV, while the low concentration ion implantation is carried out using $P^+$ ions at a concentration of about $2.0 \times 10^{13}$ ions/cm$^2$ with an energy of about 30 KeV.

The high concentration ion implantation may be carried out using $As^+$ ions at a concentration of about $1.0 \times 10^{15}$ to $5.0 \times 10^{15}$ ions/cm$^2$ with an energy of about 20 to 40 KeV, and the low concentration ion implantation may be carried out using $P^+$ ions at a concentration of about $2.0 \times 10^{13}$ to $3.0 \times 10^{13}$ with an energy of about 20 to 40 KeV.

According to the present invention, the process for formation of the gate electrode of the MOS transistor includes the steps of: (a) forming an oxidation preventing layer having an etch selectivity with a silicon oxide layer on a semiconductor substrate, and carrying out a photo etching process to etch the oxidation preventing layer of the portion where a gate electrode of the transistor is to be formed, so as to define the portion of the gate electrode; (b) forming an oxide layer by oxidizing the substrate portion of the gate electrode region of the transistor, and carrying out an anisotropic etching on the oxide layer by using the oxidation preventing layer as the mask, so as for the substrate to be exposed; and (c) forming a gate insulating layer, depositing a conductive layer (to be formed into the gate electrode), and carrying out an etch back until the oxidation preventing layer is exposed, thereby forming the gate electrode in a self-aligned form.

The thickness of the oxide layer is about 1500 to 5000 Å, and the etching of the oxide layer is carried out by applying a reactive ion etching process, while the oxidation preventing layer is formed utilizing a silicon nitride layer.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

A first embodiment of the present invention will be described referring to FIG. 5.

The process for formation of an nMOSFET from a p-type substrate or well will be described. As to the formation of a pMOSFET from an n-type substrate, the impurity type has only to be substituted.

Figure 1:
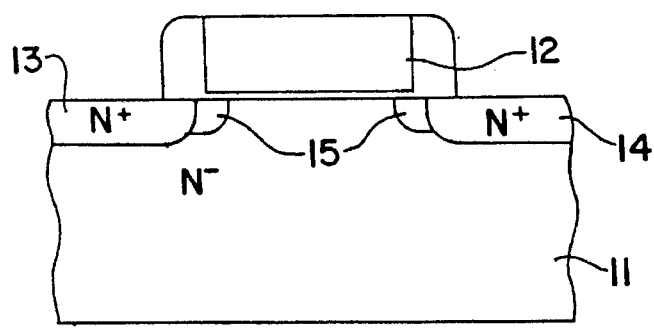
FIGS. 1 to 4 are sectional views for illustration of conventional semiconductor MOS transistors, and processes for formation thereof.
Figure 2:
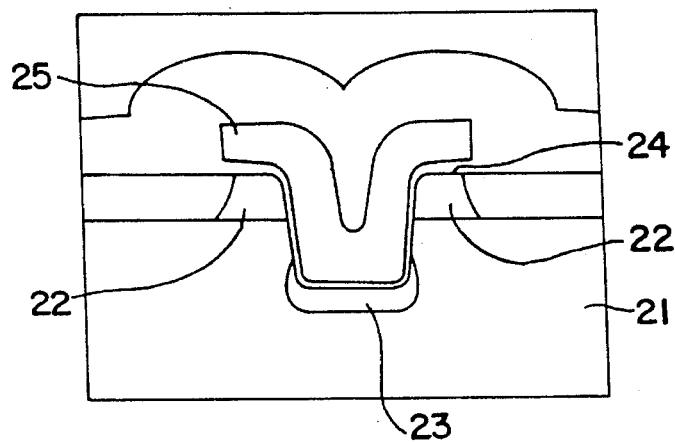
Figure 3:
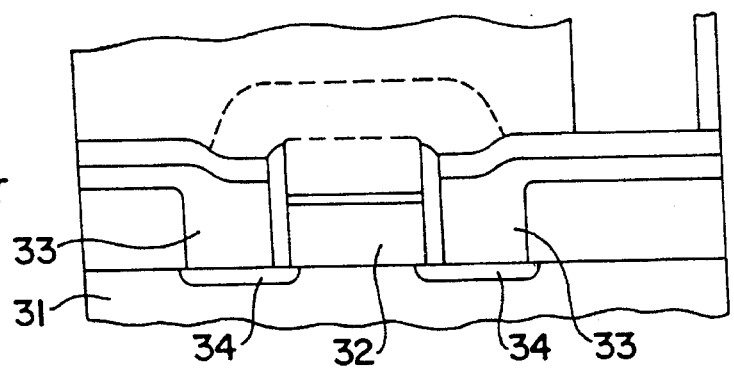
Figure 4:
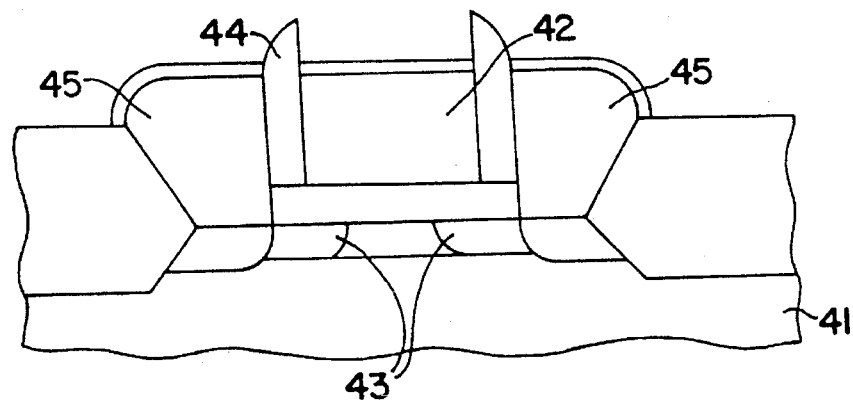
Figure 5A:
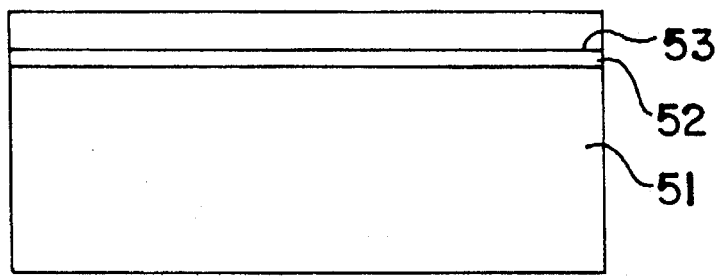
FIGS. 5 and 6 are sectional views for illustration of a semiconductor MOS transistor and the process for formation thereof according to the present invention.

First, as illustrated in FIG. 5A, thermal oxide layer 52 as an insulating layer is formed on silicon substrate 51 at a temperature of about 900° C. under an $H_2/O_2$ atmosphere to a thickness of about 150 Å. silicon nitride layer 53 as an oxidation preventing layer is deposited to a thickness of about 1500 Å by applying an LPCVD (low pressure chemical vapor deposition) method.

Figure 5B:
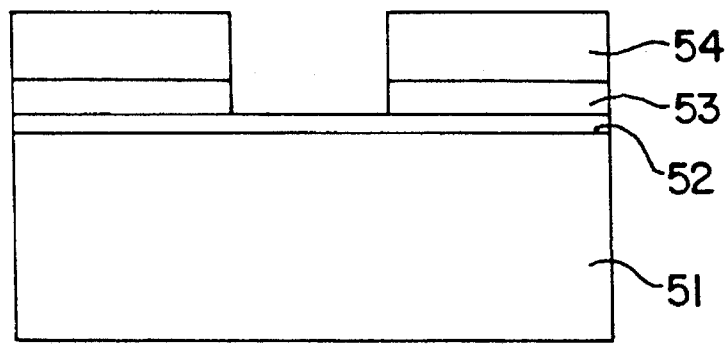

As illustrated in FIG. 5B, a pattern for forming a channel region of the transistor is formed by etching $Si_3N_4$ layer 53 by applying a photography process and utilizing photo resist 54. Under this condition, the etching of the $Si_3N_4$ film is carried out using $CHF_3/CF_4$ and applying an RIE (reactive ion etching) process. An ion implantation for controlling the threshold voltage of the transistor is carried out under the conditions of $BF^{2+}$, about 40 KeV in energy, and a concentration of about $3.0 \times 10^{12}$ ions/cm².

Figure 5C:
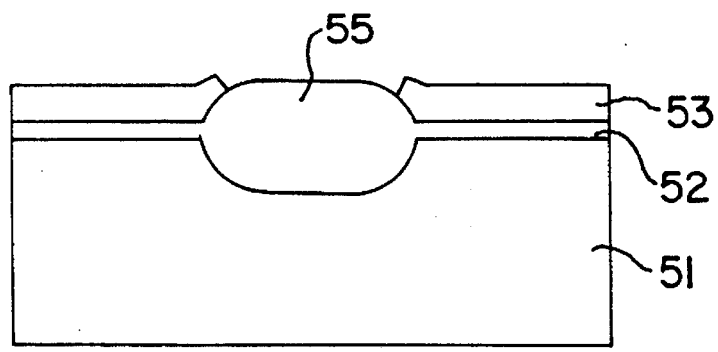

As illustrated in FIG. 5C, photo resist 54 is removed by dipping into an $H_2SO_4/H_2O_2$ solution. An oxidation process for forming a transistor channel region is carried out at a temperature of about 900° C. and under an $H_2/O_2$ atmosphere in such a manner that the thickness of oxide layer 55 becomes about 2500 Å.

Figure 5D:
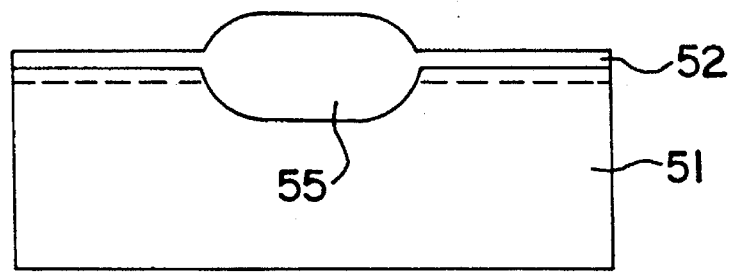

As illustrated in FIG. 5D, nitride layer 53 is removed by dipping into an $H_3PO_4$ solution having a temperature of about 180° C. An ion implantation (first ion implantation) is carried out using phosphorus ions at a concentration of about $2.0 \times 10^{13}$ with an energy of about 30 KeV. At the next step, the ion implanted impurity is diffused by applied heat, thereby forming LDD region 56.

Figure 5E:
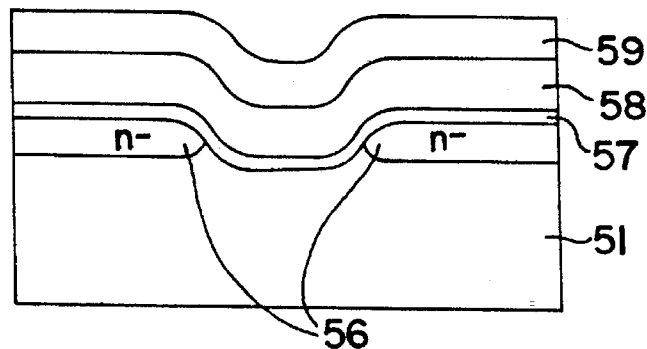

As illustrated in FIG. 5E, thick oxide layer 55 for forming the channel is removed by dipping into an aqueous HF solution (50:1), and thus the channel region is made to have an elliptical cross section. In order to form gate insulating layer 57, an oxidation process is carried out at a temperature of about 850° C. under an $H_2/O_2$ atmosphere, thereby forming an $SiO_2$ layer with a thickness of about 100 Å. Doped polysilicon layer 58 containing phosphorus ions is deposited in an in-situ manner by applying an LPCVD method. Silicon oxide layer 59 is deposited to a thickness of about 1500 Å by applying an LPCVD method.

Figure 5F:
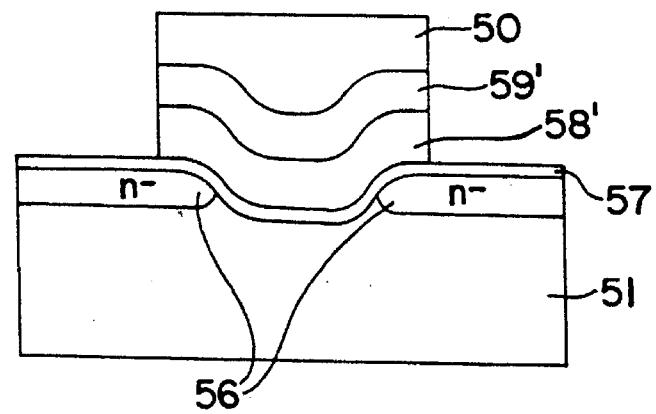

As illustrated in FIG. 5F, gate line 58' is defined by applying a photolithography method. That is, photo resist pattern 50 is formed through exposure and development, and LPCVD $SiO_2$ layer 59 is etched by applying an RIE method to form cap gate oxide 59' and by using $CHF_3/CF_4$ chemicals. Polysilicon film 58 is RIE-etched to form gate line 58' by using $Cl_2/O_2$.

Figure 5G:
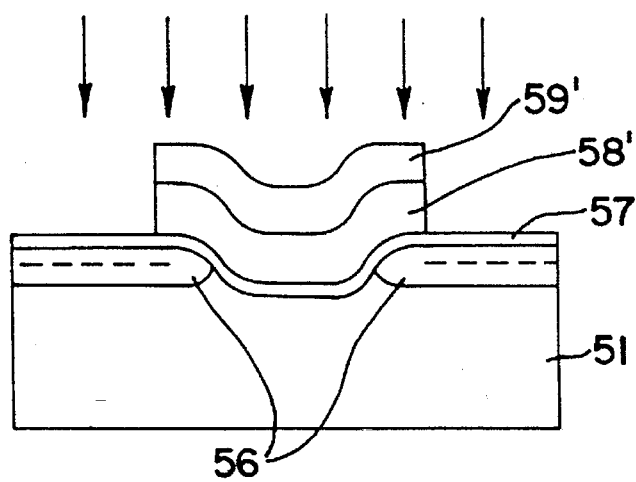

As illustrated in FIG. 5G, photo resist pattern 50 is removed by dipping into an $H_2SO_4/H_2O_2$ solution. An impurity ion implantation (second ion implantation) for forming an n⁺ source/drain region is carried out using As⁺ ions at a concentration of about $5.0 \times 10^{15}$ ions/cm² with an energy of about 40 KeV.

Figure 5H:
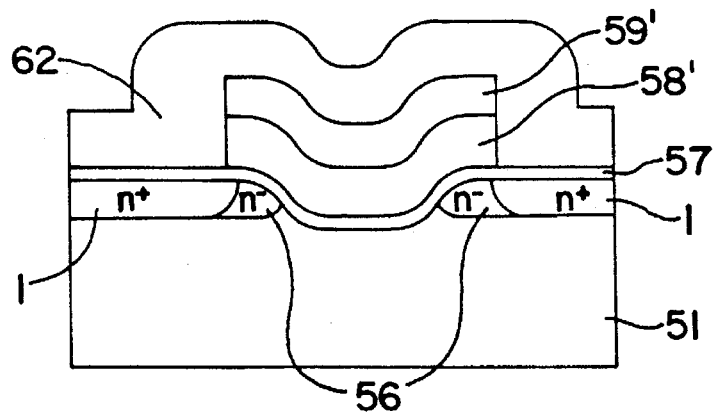

As illustrated in FIG. 5H, CVD $SiO_2$ layer 2 is deposited to a thickness of about 2000 Å, and an annealing is carried out for forming n⁺ source/drain region 1.

The subsequent sequence is carried out based on conventional methods for making a MOS transistor.

The MOS field effect transistor according to the present invention is manufactured based on the method described above. As to its constitution, the transistor includes silicon substrate 51 with an elliptical recess on the surface thereof, gate line 58' having an elliptical lower cross section and disposed on the elliptical recess, insulating layer 57 being interposed between the recess and the gate line, and source/ drain regions 1 having low impurity concentration region 56 and disposed at the opposite sides of gate line 58' across the transistor channel.

Here, if the silicon substrate is p-type, and if the diffusion layer and the source/drain region are doped with an n type impurity, then it becomes an nMOS field effect transistor. On the other hand, if the silicon substrate is n-type, and if the diffusion layer and the source/drain region are doped with a p-type impurity, then it becomes a pMOS field effect transistor.

A second embodiment of the present invention will be described.

Figure 6A:
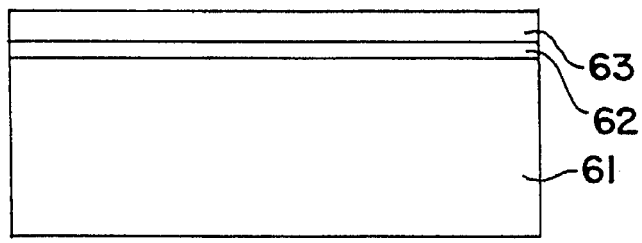

As illustrated in FIG. 6A, thermal oxide layer 62 for serving as an insulating layer is grown to a thickness of about 150 Å at a temperature of about 900° C. under an $H_2/O_2$ atmosphere on silicon substrate 61 (having a p-type well). Silicon nitride layer $Si_3N_4$ 63 as an oxidation preventing layer is deposited to a thickness of about 1500 Å by applying an LPCVD method.

Figure 6B:
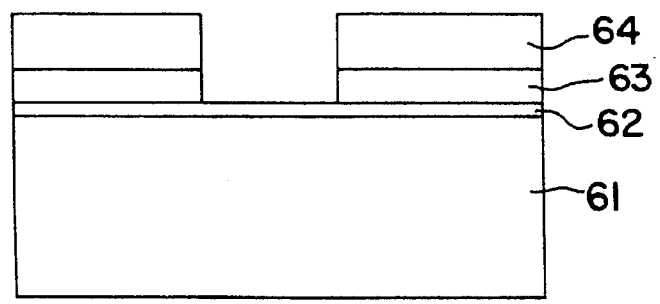

As illustrated in FIG. 6B, in order to define the gate line of the transistor, a photolithography method is carried out utilizing photo resist 64. $Si_3N_4$ layer 63 is RIE-etched using $CHF_3/CF_4$.

Figure 6C:
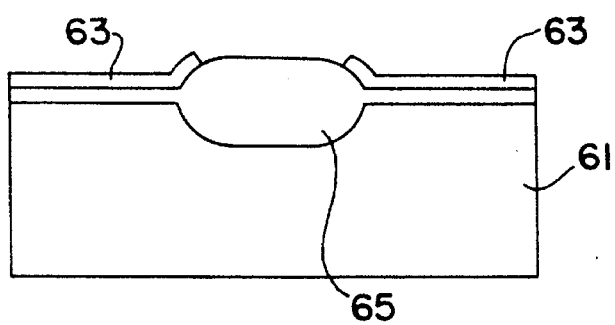

As illustrated in FIG. 6C, photo resist film 64 is removed by dipping into an $H_2SO_4/H_2O_2$ solution. The portion of the silicon substrate which is not protected by nitride layer 63, i.e., the channel region, is thermally oxidized at a temperature of about 900° C. under an $H_2/O_2$ atmosphere so as to form $SiO_2$ layer 65.

Figure 6D:
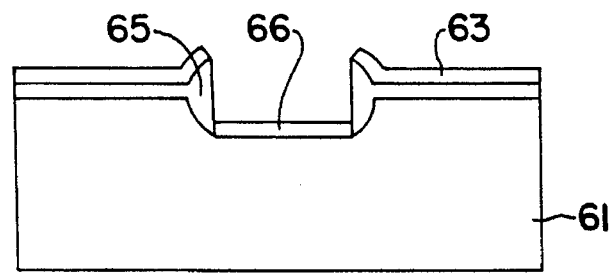

As illustrated in FIG. 6D, silicon oxide layer 65 is etched using nitride layer ($Si_3N_4$) 63 as a mask until silicon substrate 61 is exposed. Under this condition, the channel of the transistor is self-aligned by $Si_3N_4$ layer 63. The $SiO_2$ layer is thermally oxidized to about 100 Å at a temperature of about 900° C. under an $H_2/O_2$ atmosphere, thereby forming gate insulating layer 66.

Figure 6E:
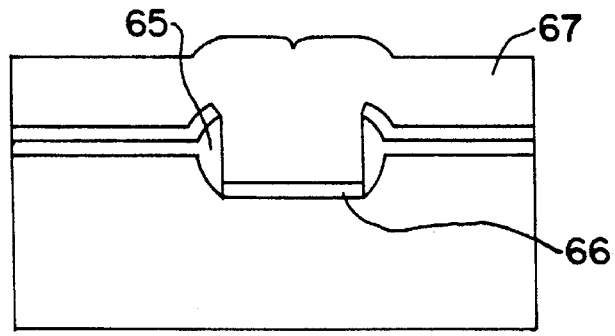

As illustrated in FIG. 6E, polysilicon layer 67 is deposited to a thickness of about 3500 Å by applying an LPCVD method. Under this condition, the polysilicon layer completely fills the recess over the transistor gate channel. The doping of polysilicon layer 67 is carried out by injecting $PH_3$ gases during the deposition so that phosphorus may be doped in an in-situ manner.

Figure 6F:
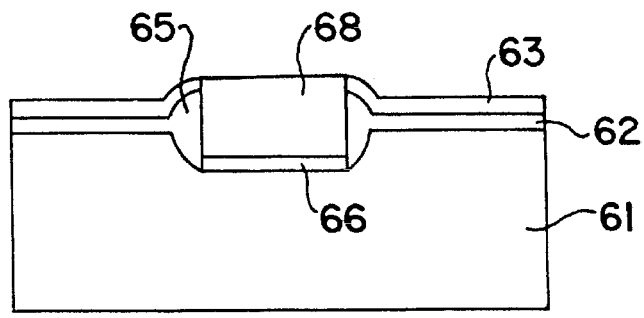

As illustrated in FIG. 6F, the polysilicon layer is etched using $HBr/Cl_2$ until silicon nitride layer 63 becomes exposed, so that gate line 68 may automatically be formed in a recessed shape.

Figure 6G:
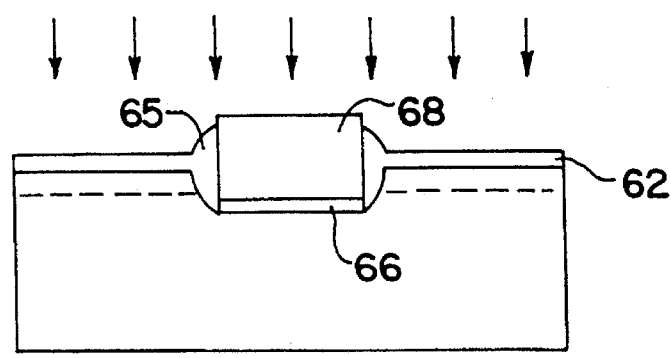

As illustrated in FIG. 6G, $Si_3N_4$ film 63 is removed by dipping into an $H_3PO_4$ solution at a temperature of about 180° C. In order to form an n⁺ source/drain region, a high concentration As⁺ ion implantation is carried out at a concentration of about $5.0 \times 10^{15}$ ions/cm² with an energy of about 40 KeV.

Figure 6H:
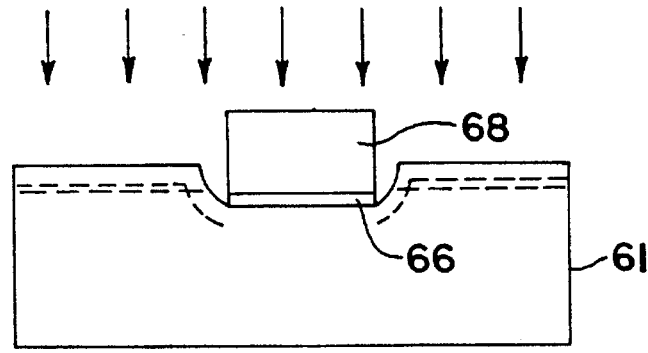

As illustrated in FIG. 6H, $SiO_2$ layers 62 and 65 are removed by dipping into an aqueous HF solution (50:1). In order to form an n⁻ source/drain region (LDD), a low concentration ion implantation is carried out using phosphorus ions at a concentration of about $2.0 \times 10^{13}$ ions/cm² with an energy of about 30 KeV.

Figure 6I:
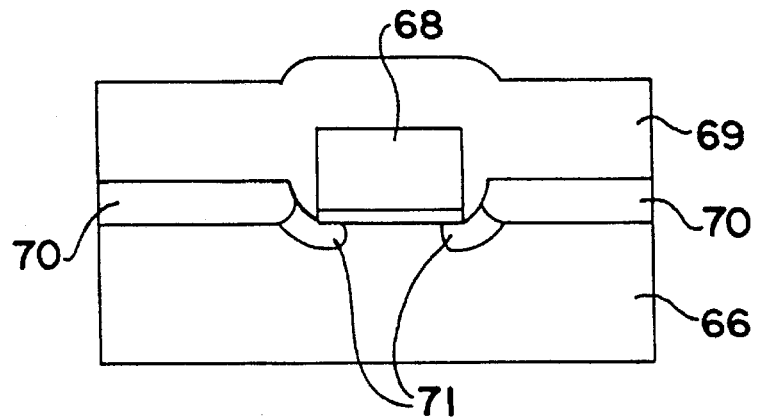

As illustrated in FIG. 6I, $SiO_2$ layer 69 is deposited to a thickness of about 2000 Å by applying a CVD method. In order to form source/drain region 70 having LDD region 71, a heat treatment is carried out at a temperature of about 870° C. under an $N_2$ atmosphere for about 40 minutes.

The subsequent procedure is carried out based on usual MOS transistor manufacturing procedures, thereby completing the formation of the transistor.

The thickness of the oxide layer is made to come into the range of about 1500 to 5000 Å. The high concentration ion implantation is carried out using $As^+$ ions at a concentration of about $5.0\times10^{15}$ ions/cm$^2$ with an energy of about 20 to 40 KeV. The low concentration ion implantation is carried out using $P^+$ ions at a concentration of about $2.0\times10^{13}$ to $3.0\times10^{13}$ ions/cm$^2$ with an energy of about 20 to 40 KeV.

According to the present invention, the process for formation of the gate electrode of the MOS transistor includes the steps of (a) forming an oxidation preventing layer having an etch selectivity with a silicon oxide layer on a semiconductor substrate, and carrying out a photo etching process to etch the oxidation preventing layer of the portion where a gate electrode of the transistor is to be formed, so as to define the portion of the gate electrode, (b) forming an oxide layer by oxidizing the substrate portion of the gate electrode region of the transistor, and carrying out an anisotropic etching on the oxide layer by using the oxidation preventing layer as the mask, so as for the substrate to be exposed, (c) forming a gate insulating layer, depositing a conductive layer (to be formed as a gate electrode), and carrying out an etch back until the oxidation preventing layer is exposed, thereby forming the gate electrode in a self-aligned form. The specific procedures may be based on the those of the first and second embodiments of the present invention.

According to the present invention as described above, a process for formation of a MOSFET in which the source/drain region is positioned higher than the gate is disclosed. In this process, a shallow junction is possible, and, therefore, the short channel effect of the transistor is improved. Further, the elevated source/drain region is not composed of polysilicon, but composed of a monocrystalline silicon, and, therefore, the boundary portion between the polysilicon layer and the silicon substrate comes within the depletion region of the source/drain region during the operation of the transistor, thereby solving the leakage current problem.

Further, unlike the conventional elevated source/drain structure in which a polycrystal or monocrystal is grown on a silicon substrate by applying a selective CVD method, the present invention provides that the gate channel is recessed to below the surface of the silicon substrate. Therefore, the hot carrier characteristics and the short channel effect of the transistor are greatly improved.

Further, in the conventional method, a new technique and additional process steps are required in manufacturing the transistor which is provided with an elevated source/drain region based on the conventional selective CVD method. However, according to the present invention, an existing technique is used as it is, with the result that the product cost and the productivity are markedly improved.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A process for formation of an MOS transistor comprising the steps of:
   (a) forming an insulating layer and an oxidation preventing layer on a semiconductor substrate, and removing a portion of the oxidation preventing layer corresponding to a gate region of the MOS transistor;
   (b) carrying out a thermal oxidation on the semiconductor substrate so as to form an oxide layer on the gate region, and etching anisotropically the oxide layer utilizing the oxidation preventing layer as a mask to expose the semiconductor substrate, wherein a portion of the oxide layer remains at peripheral portions of the gate region;
   (c) forming a gate insulating layer, and depositing a conductive layer in the gate region so as to form a gate electrode;
   (d) removing the oxidation preventing layer, and carrying out a first ion implantation; and
   (e) removing remaining portions of the insulating layer and the oxide layer, and carrying out a second impurity ion implantation.

2. The process of claim 1, wherein the thickness of the oxide layer is about 1500 to 5000 Å.

3. The process of claim 1, wherein, at said step (b), the oxide layer is etched by applying a reactive ion etching process.

4. The process of claim 1, wherein the oxidation preventing layer comprises silicon nitride.

5. The process of claim 1, wherein, at said step (c), the conductive layer comprises doped polysilicon.

6. The process of claim 1, wherein:
   at said step (a), the insulating layer on the semiconductor substrate comprises a thermally oxidized silicon oxide layer;
   at said step (e), the remaining insulating layer is removed by applying a wet etching method; and
   at said step (e), after carrying out the second impurity ion implantation, an insulating layer is formed on the semiconductor substrate, and a heat treatment is carried out.

7. The process of claim 1, wherein the gate insulating layer is formed by thermally oxidizing the semiconductor substrate.

8. The process of claim 1, wherein the semiconductor substrate includes a p well and an n well, and is divided into a non-active region and an active region for forming semiconductor devices.

9. The process of claim 1, wherein the first impurity ion implantation is carried out at a first ion concentration, and the second impurity ion implantation is carried out at a second ion concentration, wherein the first ion concentration is greater than the second ion concentration.

10. The process of claim 9, wherein, at said step (d), the first ion concentration implantation is carried out at a concentration of about $1.0\times10^{15}$ to $5.0\times10^{15}$ ions/cm$^2$ with an energy of about 20 to 40 KeV.

11. The process of claim 9, wherein, at said step (e), the second ion concentration implantation is carried out at a concentration of about $2.0\times10^{13}$ to $3.0\times10^{13}$ ions/cm$^2$ with an energy of about 20 to 40 KeV.

* * * * *